(12) United States Patent
Galler

(10) Patent No.: US 11,145,461 B2
(45) Date of Patent: Oct. 12, 2021

(54) MULTILAYER COMPONENT AND USE OF OUTER ELECTRODES

(71) Applicant: TDK Electronics AG, Munich (DE)

(72) Inventor: Martin Galler, Kalsdorf (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/097,224

(22) PCT Filed: Apr. 26, 2017

(86) PCT No.: PCT/EP2017/059864
§ 371 (c)(1),
(2) Date: Oct. 26, 2018

(87) PCT Pub. No.: WO2017/186759
PCT Pub. Date: Nov. 2, 2017

(65) Prior Publication Data
US 2019/0139707 A1  May 9, 2019

(30) Foreign Application Priority Data

Apr. 26, 2016 (DE) .......................... 202016102203.7
May 11, 2016 (DE) .......................... 102016108694.0

(51) Int. Cl.
*H01G 4/232* (2006.01)
*H01G 4/30* (2006.01)
(Continued)

(52) U.S. Cl.
CPC .......... *H01G 4/232* (2013.01); *F02M 57/005* (2013.01); *H01G 4/30* (2013.01); *H01L 41/0472* (2013.01);
(Continued)

(58) Field of Classification Search
CPC .......... H91G 4/005; H01G 4/06; H01G 4/012; H01G 4/12; H01G 4/30; H01G 4/232; H01L 41/04; H01L 41/047
See application file for complete search history.

(56) References Cited

U.S. PATENT DOCUMENTS 4,545,254 A * 10/1985 Lawless ................ G01L 9/0005
361/282
4,564,782 A * 1/1986 Ogawa ................... H03H 9/562
310/358
(Continued)

FOREIGN PATENT DOCUMENTS

CN  1282085 A  1/2001
CN  105453288 A  3/2016
(Continued)

OTHER PUBLICATIONS

Wikipediaauszug "Symmetrie (Geometrie)" downloaded from https://de.wikipedia.org/wiki/Symetrie_%28Geometrie%29-Bearbeitungsstand, Apr. 15, 2016, 5 pages with Translation.

*Primary Examiner* — David M Sinclair
(74) *Attorney, Agent, or Firm* — Slater Matsil, LLP

(57) ABSTRACT

A multilayer component is disclosed. In an embodiment, a multilayer component includes a main body having a plurality of alternately arranged ceramic layers and inner electrodes and at least two outer electrodes for electrically contacting the inner electrodes, wherein the at least two outer electrodes have a different polarity, and wherein the outer electrodes have a different geometric shape and/or a different size and/or a different arrangement at an outer surface of the main body for identifying the different polarity.

11 Claims, 2 Drawing Sheets

(51) Int. Cl.
    *H01L 41/113* (2006.01)
    *H01L 41/187* (2006.01)
    *F02M 57/00* (2006.01)
    *H01L 41/047* (2006.01)
    *H01L 41/293* (2013.01)

(52) U.S. Cl.
    CPC ...... *H01L 41/1132* (2013.01); *H01L 41/1876* (2013.01); *H01L 41/293* (2013.01); *F02M 2200/247* (2013.01)

(56) References Cited

U.S. PATENT DOCUMENTS

| | | | | |
|---|---|---|---|---|
| 4,887,186 | A * | 12/1989 | Takeda | H01G 4/008 361/321.4 |
| 2004/0251783 | A1* | 12/2004 | Kanaya | B41J 2/1614 310/328 |
| 2006/0042060 | A1* | 3/2006 | Goat | H01L 41/257 29/25.35 |
| 2007/0103036 | A1 | 5/2007 | Nakagawa et al. | |
| 2008/0074826 | A1* | 3/2008 | Lee | H01G 4/232 361/306.3 |
| 2010/0220426 | A1* | 9/2010 | Shimizu | H01G 4/12 361/306.3 |
| 2010/0321860 | A1* | 12/2010 | Osawa | H01G 4/012 361/303 |
| 2011/0205684 | A1* | 8/2011 | Yamamoto | H01G 4/232 361/305 |
| 2012/0187211 | A1* | 7/2012 | Nakamura | H01L 41/273 239/102.2 |
| 2013/0241360 | A1 | 9/2013 | Nishimura et al. | |
| 2013/0342083 | A1* | 12/2013 | Schmidt | H02N 2/067 310/366 |
| 2014/0319973 | A1 | 10/2014 | Motani et al. | |
| 2015/0042439 | A1* | 2/2015 | Matsushita | H01F 17/0013 336/200 |
| 2015/0279568 | A1* | 10/2015 | Saito | H01G 4/30 361/301.4 |
| 2016/0056366 | A1* | 2/2016 | Nakamura | H01L 41/083 310/357 |
| 2016/0126013 | A1* | 5/2016 | Park | H01G 4/30 174/260 |
| 2016/0141478 | A1 | 5/2016 | Nakamura et al. | |

FOREIGN PATENT DOCUMENTS

| | | |
|---|---|---|
| CN | 105474416 A | 4/2016 |
| DE | 102008054556 A1 | 6/2010 |
| DE | 102009029571 A1 | 3/2011 |
| JP | 58107618 A * | 6/1983 |
| JP | 09260194 A * | 10/1997 |
| JP | 11026297 A * | 1/1999 |
| JP | 2005005680 A | 1/2005 |
| JP | 2007081005 A * | 3/2007 |
| JP | 2014216494 A | 11/2014 |
| JP | 6004118 B2 | 10/2016 |
| JP | WO2015060132 A1 | 3/2017 |
| WO | 2015019810 A1 | 2/2015 |

* cited by examiner

MULTILAYER COMPONENT AND USE OF OUTER ELECTRODES

This patent application is a national phase filing under section 371 of PCT/EP2017/059864, filed Apr. 26, 2017, which claims the priority of German patent application 202016102203.7, filed Apr. 26, 2016 and German patent application 102016108694.0, filed May 11, 2016, each of which is incorporated herein by reference in its entirety.

TECHNICAL FIELD

The invention relates to a multilayer component, in particular a ceramic multilayer component. The invention furthermore relates to the use of outer electrodes for a multilayer component.

BACKGROUND

In many multilayer components it is important for the performance for positive and negative polarities at the multilayer component to be correctly connected to the corresponding polarities of the driving system. This is generally the case if ordering states have to be produced in the ceramic in order to ensure the performance of the multilayer component. One typical example is the process step of polarization in PZT (lead zirconate titanate) multilayer components, in which domains are aligned under the influence of an electric field. For such multilayer components, the polarity assignment defined in the production chain must remain known in further process steps.

By way of example, the polarity-correct printing of an inscription or the polarity-correct provision of a chamfer at the multilayer component is known.

SUMMARY OF THE INVENTION

Embodiments provide an improved multilayer component and the use of improved outer electrodes for a multilayer component.

In accordance with one aspect, a multilayer component is specified. The multilayer component comprises a main body. The main body has a multiplicity of alternately arranged ceramic layers and inner electrodes. The ceramic layers comprise, for example, a PZT material doped with Nd. The inner electrodes comprise silver and/or palladium, for example. The inner electrodes are arranged, for example, at a distance of 0.1 mm to 0.8 mm, for example, of 0.4 mm+/−0.05 mm, from one another. The distance corresponds approximately to the thickness of the ceramic layers.

The component comprises at least two outer electrodes for electrically contacting the inner electrodes. By way of example, the multilayer component comprises at least a first inner electrode electrically connected to a first outer electrode and a second inner electrode electrically connected to a second outer electrode.

The outer electrodes are arranged, for example, in layer form on opposite side surfaces of the main body. In particular, the outer electrodes can be configured as sputtering layers. The outer electrodes can comprise the materials chromium, nickel and silver. By way of example, the outer electrodes have a CrNiAg layer construction.

The at least two outer electrodes have a different polarity. During the production of the multilayer component, the ceramic layers are polarized by an electrical voltage being applied between the outer electrodes. This polarization defines the electrical connection of the multilayer component during operation. In particular, one of the outer electrodes is configured as positive outer electrode and one of the outer electrodes as negative outer electrode.

The outer electrodes have a different geometric shape. Alternatively or additionally, the outer electrodes have a different size. Alternatively or additionally, the outer electrodes have a different arrangement at an outer surface or side surface of the main body. In particular, the outer electrodes are configured in such a way that their plan views are not convertible into one another by rotation.

The different embodiment of the outer electrodes serves for identifying the different polarity of the outer electrodes. In the process chain, applying the outer electrodes always takes place before the process step of producing ordering in the ceramic since drivable inner electrodes are required for this purpose. If this process step is carried out positionally correctly with respect to the polarity markings already present, then it is always possible thereafter to identify the polarity at the multilayer component.

By means of the outer electrodes that are always present at the multilayer component, the polarity can thus be marked in a simple and cost-effective manner. In this case, an additional function is assigned to the outer electrodes. Additional outlay for applying a polarity marking can be obviated since the outer electrode has to be fitted in any case. The correct mounting of the multilayer component, in particular the correct electrical connection of the outer electrodes, is ensured in a simple and cost-effective manner. A cost-effective, simple and consumer-friendly multilayer component is thus made available.

In accordance with one exemplary embodiment, the first outer electrode has a smaller area than the second outer electrode, or vice versa. In particular, the outer electrodes for polarity marking have different areas. What is crucial is that the dimensioning of at least one of the outer electrodes is increased above the extent required for the actual function of the respective outer electrode. The further outer electrode can have an area or dimensioning that is exactly required for the actual function of the outer electrode. The polarity of the outer electrodes can thus be differentiated in a simple manner.

In accordance with one exemplary embodiment, the outer electrodes each have a width in a direction perpendicular to a stacking direction of the ceramic layers. The width of the first outer electrode is smaller than the width of the second outer electrode. The opposite case is also conceivable, in which the width of the second outer electrode is smaller than the width of the first outer electrode.

The outer electrodes each have a height in a direction parallel to a stacking direction of the ceramic layers. The height of the first outer electrode can be greater than the height of the second outer electrode, or vice versa.

In one exemplary embodiment, the outer electrodes have the same height, but different widths. In one exemplary embodiment, the outer electrodes have the same width, but different heights.

In accordance with one exemplary embodiment, the first outer electrode has a rectangular shape and the second outer electrode has a round shape, or vice versa.

In accordance with one exemplary embodiment, the multilayer component is embodied in rotationally symmetrical fashion. The multilayer component is, for example, symmetrical with respect to a rotation about a vertical axis extending in the stacking direction of the multilayer component. The main body has, in particular, side surfaces situated opposite one another, wherein the respective outer electrode is arranged centrally on the respective side surface of the main body.

In accordance with one exemplary embodiment, the multilayer component has a broken rotational symmetry. The main body has side surfaces situated opposite one another, wherein one of the outer electrodes is arranged offset toward an edge delimiting the respective side surface. The multilayer component is, for example, asymmetrical with respect to a rotation by 180° about a vertical axis extending in the stacking direction of the multilayer component.

In accordance with one exemplary embodiment, the multilayer component is configured as a piezo-multilayer actuator, as a multilayer pressure sensor or as a ceramic capacitor.

The pressure sensor is configured, for example, as an NCS sensor (needle closing sensor) that monitors the closing of a valve needle of a fuel injection valve. The pressure sensor is configured, for example, in such a way that when a pressure acts on a top side and/or an underside of the main body, an electrical signal is able to be tapped off at the outer electrodes. In this case, the top side and underside are the sides which terminate the main body toward the top and bottom in the stacking direction of the layers. The outer electrodes are preferably arranged at side surfaces which do not form the top side and do not form the underside of the stack. In particular, the side surfaces are arranged perpendicular to the top side and underside.

In accordance with a further aspect, the use of outer electrodes is described. The outer electrodes preferably correspond to the outer electrodes described above. All features that have been described in association with the outer electrodes and the multilayer component also find application for the use, and vice versa.

The outer electrodes described above are used for a multilayer component as described above. The outer electrodes are used for identifying the different polarities of the outer electrodes, in particular for polarity marking at the multilayer component. The outer electrodes have a different geometric shape and/or a different size and/or a different arrangement on a main body of the multilayer component for polarity marking. The outer electrodes thus have an additional function enabling the polarity to be identified at the multilayer component in a simple and cost-effective manner.

BRIEF DESCRIPTION OF THE DRAWINGS

The invention is explained in greater detail below on the basis of exemplary embodiments and the associated figures.

The drawings described below should not be interpreted as true to scale. Rather, for the sake of better illustration, individual dimensions may be illustrated as enlarged, reduced or even distorted.

Elements which are identical to one another or which perform the same function are designated by identical reference signs.

Figure 1:
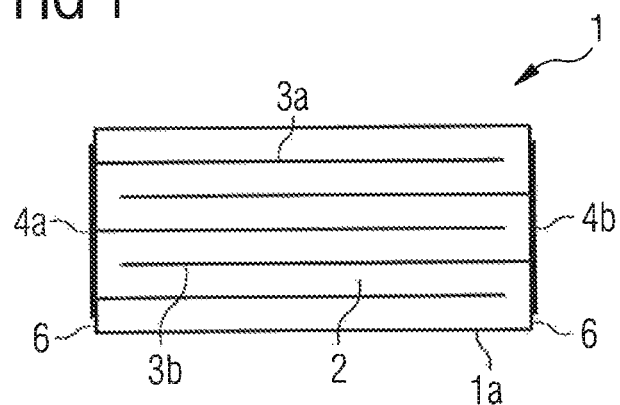
Figure 2A:
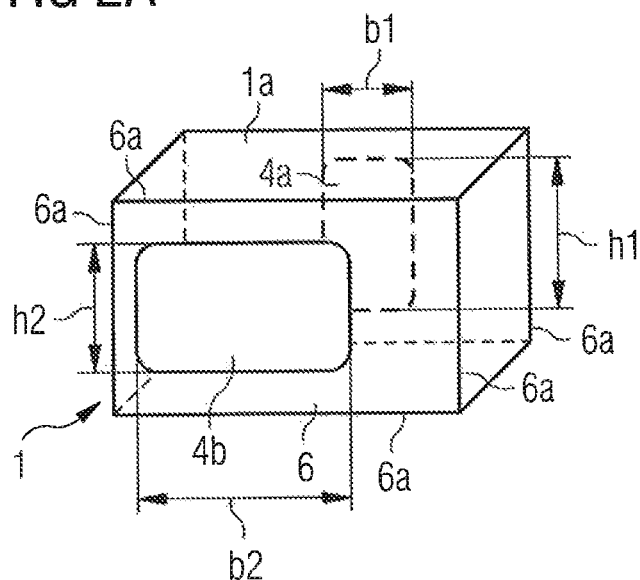
Figure 2B:
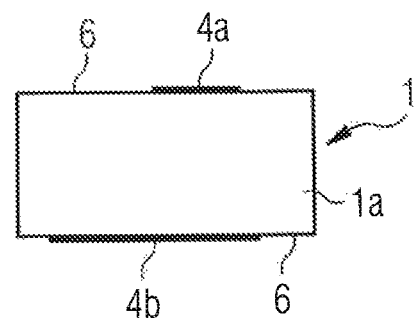
Figure 3A:
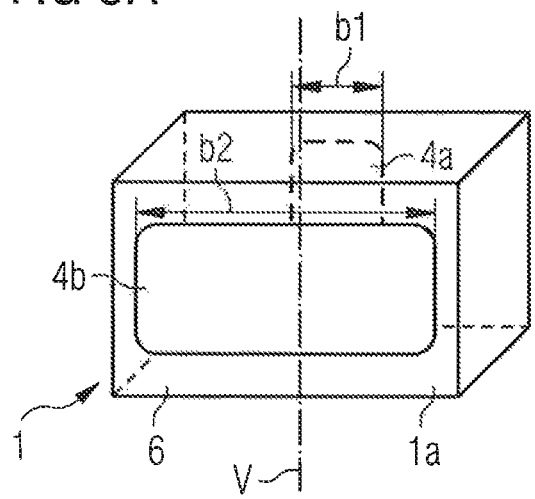
Figure 3B:
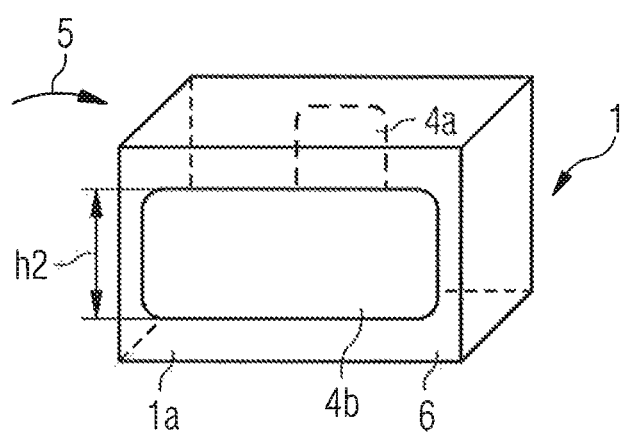
Figure 4A:
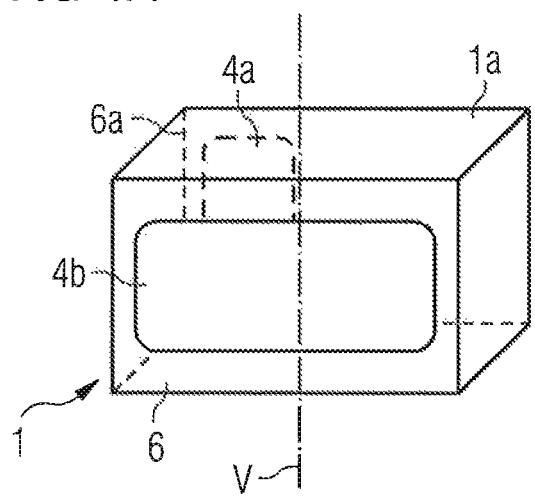
Figure 4B:
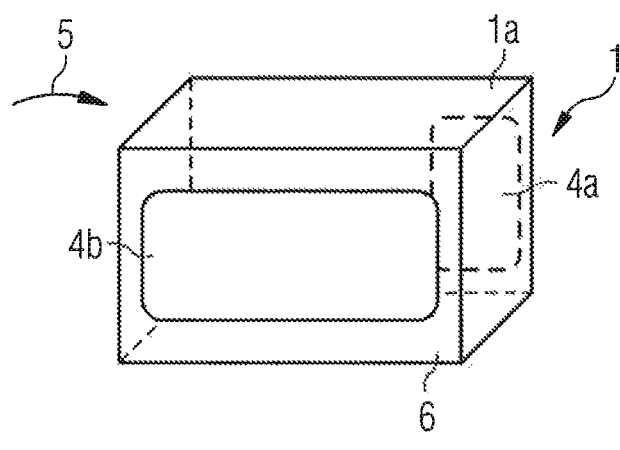

FIG. 1 shows a schematic sectional view of a multilayer component in accordance with the prior art;

FIG. 2a shows a perspective view of a multilayer component in accordance with a first exemplary embodiment;

FIG. 2b shows a plan view of the multilayer component in accordance with FIG. 2a;

FIG. 3a shows a perspective view of a multilayer component in accordance with a further exemplary embodiment;

FIG. 3b shows a perspective view of the multilayer component in accordance with FIG. 3a rotated by 180°;

FIG. 4a shows a perspective view of a multilayer component in accordance with a further exemplary embodiment; and FIG. 4b shows a perspective view of the multilayer component in accordance with FIG. 4a rotated by 180°.

DETAILED DESCRIPTION OF ILLUSTRATIVE EMBODIMENTS

FIG. 1 shows a schematic sectional view of a multilayer component in accordance with the prior art.

The multilayer component 1 comprises a main body 1a. The main body 1a has a multiplicity of ceramic layers 2. In particular, the ceramic layers 2 are piezoceramic layers. The ceramic layers 2 comprise, for example, a PZT material doped with Nd.

Inner electrodes 3a, 3b are arranged between the ceramic layers 2. The inner electrodes 3a, 3b comprise, for example, an alloy of silver and palladium.

The inner electrodes 3a, 3b serve for electrically driving the ceramic layers 2. The ceramic layers 2 and the inner electrodes 3a, 3b are arranged one above another to form a stack. A plurality of inner electrodes 3a, 3b lead out of the main body is in each case in a mutually alternating manner at a side surface 6 of the main body 1a. In particular, inner electrodes 3a, 3b assigned to a different polarity at respectively opposite side surfaces 6 of the main body is extend as far as the surface of the main body 1a.

The multilayer component 1 comprises two outer electrodes 4a, 4b arranged at opposite side surfaces 6 of the main body 1a. The outer electrodes 4a, 4b can be formed as fired metallic layers. The outer electrodes 4a, 4b are preferably formed as sputtered layers. By way of example, the outer electrodes 4a, 4b can comprise a sputtering layer composed of CrNiAg. The inner electrodes 3a, 3b are electrically conductively connected to one of the outer electrodes 4a, 4b and electrically insulating from the other outer electrode 4b, 4a alternately in the stacking direction. The outer electrodes 4a, 4b thus connect the inner electrodes 3a, 3b and enable the joint driving thereof.

The multilayer component 1 can comprise, for example, a piezo-multilayer actuator, a multilayer pressure sensor or a ceramic capacitor. The ceramic layers 2 constitute the actual functional element of the multilayer component 1. When an electrical voltage is applied to the inner electrodes 3a, 3b, they realize capacitance, mechanical travel or sensor signal output depending on the type of multilayer component 1.

During the production of the multilayer component 1, the ceramic layers 2 are polarized by an electrical voltage being applied between the outer electrodes 4a, 4b. During the polarization of the multilayer component 1, by way of example, the first outer electrode 4a is connected to a negative pole of a voltage source and the second outer electrode 4b is connected to a positive pole of a voltage source. Correspondingly, the first outer electrode 4a can be designated as negative electrode/negative outer electrode and the second outer electrode 4b can be designated as positive electrode/positive outer electrode. It goes without saying that the opposite assignment is also possible. In this regard, the second outer electrode 4b can also be created as negative electrode/negative outer electrode, and the first outer electrode 4a as positive electrode/positive outer electrode.

For the electrical performance of the multilayer component 1 it is essential that positive and negative polarities at the multilayer component 1 are correctly connected to the corresponding polarities of the driving system. FIGS. 2a to 4b are therefore concerned with embodiments which make it possible to identify the polarity at the multilayer component 1. In this case, the multilayer component 1 underlying FIGS. 2a to 4b substantially corresponds to the multilayer component 1 in accordance with FIG. 1 with the exception of the shape, dimensioning and/or arrangement of the outer electrodes 4a, 4b.

FIG. 2a shows a perspective view of a multilayer component in accordance with a first exemplary embodiment. FIG. 2b shows a plan view of the multilayer component in accordance with FIG. 2a.

In this exemplary embodiment, both outer electrodes 4a, 4b have a rectangular shape. However, other geometric shapes are also conceivable for the outer electrodes 4a, 4b, for example, a circular shape.

Different dimensionings of the outer electrodes 4a, 4b are used for polarity marking at the multilayer component 1. In this exemplary embodiment, the first outer electrode 4a has a width b1 that is smaller than the width b2 of the second outer electrode 4b. In this case, the width of the outer electrodes 4a, 4b denotes that extent of the outer electrodes 4a, 4b which extends in a direction perpendicular to a stacking direction of the ceramic layers 2. By way of example, the width b1 of the first outer electrode 4a is half the magnitude of the width b2 of the second outer electrode. In this case, the first outer electrode 4a in this exemplary embodiment denotes the negative outer electrode and the second outer electrode 4b corresponds to the positive outer electrode 4b.

The height h1 of the first outer electrode 4a is furthermore greater than the height h2 of the second outer electrode 4b. In this case, the height h1, h2 of the outer electrodes 4a, 4b denotes that extent of the outer electrodes 4a, 4b in a direction parallel to a stacking direction of the ceramic layers 2. Overall, the first outer electrode 4a has a smaller area than the second outer electrode 4b. In this regard, the area of the first outer electrode 4a is, for example, 0.4 to 0.7 times the area of the second outer electrode. By way of example, the area of the first outer electrode 4a is half the magnitude of the area of the second outer electrode.

It goes without saying, however, that the polarity assignment can also be reversed, that is to say that, for example, the width b1 of the negative outer electrode 4a can be greater than the width b2 of the positive outer electrode 4b. The height h1 of the negative outer electrode 4a can be smaller than the height h2 of the positive outer electrode 4b. The area of the negative outer electrode 4a can be greater than the area of the positive outer electrode 4b. What is crucial is that the dimensioning of at least one of the outer electrodes 4a, 4b is increased above the extent required for the actual function of the respective outer electrode 4a, 4b (the secure electrical supply of the inner electrodes 3a, 3b).

In addition, in this exemplary embodiment, the rotational symmetry of the multilayer component 1 is broken. In particular, the first outer electrode 4a is not arranged centrally on a side surface 6 of the main body 1a. Rather, the first outer electrode 4a is arranged offset toward an edge 6a delimiting the side surface 6. In other words, in a plan view of the relevant side surface 6, the first outer electrode 4a is displaced toward the left in the direction of the edge 6a of the side surface. It goes without saying that the displacement of the outer electrode 4a in a different direction is also conceivable. In a plan view of the relevant side surface 6, the first outer electrode 4a can be displaced toward the left, right, top or bottom in the direction of an edge 6a of the side surface 6.

By contrast, the second outer electrode 4b is arranged centrally on an opposite side surface 6. The polarity of the outer electrodes 4a, 4b can also be identified by the different arrangement of the outer electrodes 4a, 4b on the respective outer surface. In this regard, the negative outer electrode 4a is displaced toward an edge 6a, while the positive outer electrode 4b is formed rotationally symmetrically on the center of the side surface 6.

It goes without saying that the opposite case (central negative outer electrode 4a and offset positive outer electrode 4b) is also possible. As a result of the different arrangement of the outer electrodes 4a, 4b on the respective side surface 6, the rotational symmetry of the multilayer component 1 is broken (in this respect, also see FIGS. 4a and 4b). After rotation of the multilayer component 1 by 180° about a vertical axis v (see FIGS. 3a and 3b), the first outer electrode 4a is displaced toward the right in the direction of the edge 6a of the side surface (not explicitly illustrated).

The two outer electrodes 4a, 4b, for polarity identification, can alternatively or additionally also have different geometric shapes (not explicitly illustrated). In this regard, the first outer electrode 4a can have a circular shape and the second outer electrode 4b can have a rectangular shape, or vice versa. Other shapes are also conceivable for the outer electrodes 4a, 4b, for example, a trapezoidal shape. What is important in the case of the polarity identification purely by means of the geometric shape here is that the two outer electrodes 4a, 4b have a different geometric shape.

FIG. 3a shows a perspective view of a multilayer component in accordance with a further exemplary embodiment. FIG. 3b shows a perspective view of the multilayer component in accordance with FIG. 3a rotated by 180°.

In this exemplary embodiment, too, the first outer electrode 4a has a width b1 that is smaller than the width b2 of the second outer electrode 4b. The first outer electrode 4a has a height h1 that is greater than the height h2 of the second outer electrode 4b. Overall, the first outer electrode 4a has a smaller area than the second outer electrode 4b. In this way, the polarity of the two outer electrodes 4a, 4b can be marked and thus differentiated in a simple manner.

However, the width b1 of the first outer electrode 4a is smaller than the width b1 of the first outer electrode 4a in accordance with FIGS. 2a, 2b. In other words, the first outer electrode 4a is embodied in particularly narrow fashion in this exemplary embodiment. The height h1 of the first outer electrode 4a is greater than the height h1 of the first outer electrode 4a in accordance with FIGS. 2a, 2b. In other words, the first outer electrode 4a is embodied in particularly long fashion in this exemplary embodiment. By way of example, the first outer electrode 4a in this exemplary embodiment has an area having exactly the extent required for the actual function of the outer electrode.

By contrast, the width b2 of the second outer electrode 4b is greater than the width b2 of the second outer electrode 4b in accordance with FIGS. 2a, 2b. The height h2 of the second outer electrode 4b is smaller than the height h2 of the second outer electrode 4b in accordance with FIGS. 2a, 2b. Many different dimensionings or areas are therefore conceivable for the relevant outer electrodes 4a, 4b, as long as the respective outer electrode 4a, 4b has a minimum dimensioning that is required for the actual function of the outer electrode 4a, 4b, namely the electrical supply of the inner electrodes 3a, 3b.

Furthermore, in contrast to the exemplary embodiment in accordance with FIGS. 2a and 2b, here the rotational symmetry of the multilayer component 1 is not broken. In particular, both the first outer electrode 4a and the second outer electrode 4b are arranged centrally on opposite side surfaces 6 of the main body 1a. After rotation of the multilayer component 1 by 180° (identified by arrow 5) about the vertical axis v, both outer electrodes 4a, 4b are thus still arranged centrally on the respective side surface 6.

FIG. 4a shows a perspective view of a multilayer component in accordance with a further exemplary embodiment. FIG. 4b shows a perspective view of the multilayer component in accordance with FIG. 4a rotated by 180°.

In contrast to the exemplary embodiment shown in FIGS. 3a and 3b, the rotational symmetry of the multilayer component 1 in accordance with FIGS. 4a and 4b is broken. In particular the first outer electrode 4a is not arranged centrally on a side surface 6 of the main body 1a, but rather is arranged offset toward an edge 6a delimiting the side surface 6. In a plan view of the relevant side surface 6, the first outer electrode 4a is displaced toward the right in the direction of the edge 6a of the side surface 6.

The second outer electrode 4b is arranged centrally on an opposite side surface 6. The polarity of the outer electrodes 4a, 4b can be identified by the different arrangement of the outer electrodes 4a, 4b on the respective outer surface.

All further features of the multilayer component 1 in accordance with FIGS. 4a and 4b correspond to the features described in association with FIGS. 3a and 3b.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A multilayer component comprising:
a main body having a plurality of ceramic layers and inner electrodes alternately arranged in a stacking direction, wherein the main body has side surfaces situated opposite one another;
at least two outer electrodes for electrically contacting the inner electrodes; and
a first side face, a second side face, a third side face, a fourth side face, a fifth side face and a sixth side face,
wherein the outer electrodes have a different polarity,
wherein the outer electrodes have a different geometric shape and a different size for identifying the different polarity,
wherein the outer electrodes have an identical height and differ in their width,
wherein the height is defined as an extension in the stacking direction and the width is defined as an extension in a direction perpendicular to the stacking direction,
wherein a respective outer electrode is arranged centrally on a respective side surface of the main body,
wherein a first outer electrode of the outer electrodes is arranged only on the first side face of the multilayer component,
wherein a second outer electrode of the outer electrodes is arranged only on the second side face of the multilayer component,
wherein the first outer electrode is spaced apart from all edges delimiting the first side face,
wherein the second outer electrode is spaced apart from all edges delimiting the second side face, and
wherein each of the third side face, the fourth side face, the fifth side face and the sixth side face of the multilayer component is free of outer electrodes.

2. The multilayer component according to claim 1, wherein the first outer electrode has a smaller area than the second outer electrode.

3. The multilayer component according to claim 1, wherein the width of the first outer electrode is smaller than the width of the second outer electrode.

4. The multilayer component according to claim 1, wherein the first outer electrode has a rectangular shape and wherein the second outer electrode has a round shape.

5. The multilayer component according to claim 1, wherein the multilayer component is embodied in rotationally symmetrical fashion.

6. The multilayer component according to claim 1, wherein the multilayer component is a piezo-multilayer actuator, a multilayer pressure sensor or a ceramic capacitor.

7. The multilayer component according to claim 1, wherein the multilayer component has a broken rotational symmetry.

8. The multilayer component according to claim 1, wherein one of the outer electrodes is arranged offset toward one of the edges delimiting the respective side surface.

9. The multilayer component according to claim 1, wherein the multilayer component and the outer electrodes are symmetric with respect to a rotation of 180° around a symmetry axis of the multilayer component, wherein the symmetry axis is perpendicular to the side surfaces of the multilayer component on which the outer electrodes are arranged, and wherein the symmetry axis penetrates a centre of the side surfaces on which the outer electrodes are arranged.

10. The multilayer component according to claim 1, wherein the second outer electrode has a rectangular shape and wherein the first outer electrode has a round shape.

11. The multilayer component according to claim 1, wherein the first outer electrode has a trapezoidal shape.

* * * * *